(12) United States Patent
Ouyang et al.

(10) Patent No.: US 11,398,616 B2
(45) Date of Patent: Jul. 26, 2022

(54) ORGANIC LIGHT-EMITTING DISPLAY PANEL AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Qi Ouyang, Hubei (CN); Mugyeom Kim, Hubei (CN); Yong Zhao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 145 days.

(21) Appl. No.: 16/768,475

(22) PCT Filed: Nov. 22, 2019

(86) PCT No.: PCT/CN2019/120414
§ 371 (c)(1),
(2) Date: May 29, 2020

(87) PCT Pub. No.: WO2021/036036
PCT Pub. Date: Mar. 4, 2021

(65) Prior Publication Data
US 2021/0408444 A1    Dec. 30, 2021

(30) Foreign Application Priority Data

Aug. 26, 2019 (CN) .................. 201910789904.X (51) Int. Cl.
*H01L 51/52* (2006.01)
*H01L 51/56* (2006.01)
(Continued)

(52) U.S. Cl.
CPC ........ *H01L 51/5237* (2013.01); *H01L 27/323* (2013.01); *H01L 27/3246* (2013.01); *H01L 51/5064* (2013.01); *H01L 51/56* (2013.01)

(58) Field of Classification Search
CPC ............ H01L 51/5237; H01L 27/3246; H01L 51/5253
See application file for complete search history.

(56) References Cited

U.S. PATENT DOCUMENTS

2019/0288047 A1* 9/2019 Jeong .................. H01L 51/5256
2020/0006704 A1* 1/2020 Zhang ................. H01L 27/3244
(Continued)

FOREIGN PATENT DOCUMENTS

CN    106773209 A    5/2017
CN    107025451 A    8/2017
(Continued)

*Primary Examiner* — Fernando L Toledo
*Assistant Examiner* — Valerie N Newton (57) ABSTRACT

An organic light-emitting display panel and a manufacturing method thereof are provided. A thin-film encapsulation layer in the organic light-emitting panel extends to cover a wall surface of the functional structure layer facing to a light-transmitting hole, and comprehensively protects the functional structure layer and the light-emitting layer.

10 Claims, 5 Drawing Sheets

(51) Int. Cl.
*H01L 27/32* (2006.01)
*H01L 51/50* (2006.01)

(56) References Cited

U.S. PATENT DOCUMENTS

2020/0358024 A1* 11/2020 Choi .................. H01L 51/5209
2021/0005836 A1* 1/2021 Yee .................... H01L 51/5281

FOREIGN PATENT DOCUMENTS

| CN | 108666352 A | 10/2018 |
| CN | 109802052 A | 5/2019 |
| CN | 109920938 A | 6/2019 |

* cited by examiner

ORGANIC LIGHT-EMITTING DISPLAY PANEL AND MANUFACTURING METHOD THEREOF

CROSS REFERENCE TO RELATED APPLICATIONS

This application claims the priority of China Patent Application serial No. 201910789904.X, filed on Aug. 26, 2019, the disclosures of which are incorporated herein by reference in their entirety.

FIELD OF INVENTION

The present invention relates to the fields of display, and in particular to an organic light-emitting diode display panel and a manufacturing the same.

BACKGROUND OF INVENTION

Organic light-emitting diodes (OLEDs) are a developing flat-panel display technology. OLED display technology differs from traditional LCD display means, does not require a backlight module, and employs a very thin coating of organic materials and a glass substrate. When an electric current passes, these organic materials emit light. Because OLED displays have the advantages, such as simple manufacturing processes, lower costs, low power consumption, high luminous brightness, wide ranges of operating temperature adaptability, light weight, fast response time, easy implementation of color display, large screen display, easy cooperation with integrated circuit drivers, and easy implementation of flexible display, so it has prospects of broad application ranges.

Full screen technology is a broad definition of ultra-high screen ratio mobile phone designs for the display industry. Literally, the whole front of a mobile phone is a screen, the display interface of the mobile phone is completely covered by the screen, the four bezels of the mobile phone are all designed to be borderless, and the ultra-high screen ratio is close to 100%. However, due to the basic functional requirements of the mobile phone, such as front camera, handset, proximity sensor and ambient light sensor, the display device still needs spaces to provide light accessing channels for these devices. Although various mobile phone manufacturers have proposed various solutions, the front opening is always a difficult problem. The disposition of a punched screen is used to reduce an area occupied by the front camera, and to minimize it.

However, because OLEDs are susceptible to invasion of moisture and oxygen, the encapsulation performance at the punched holes faces a challenge. Meanwhile, an amount of light incident to the camera and the punching process of the punched holes must be considered.

SUMMARY OF INVENTION

Technical Problem

An object of the present invention is to provide an organic light-emitting display panel and a manufacturing method thereof, so as to solve the problems existing in the prior art that the encapsulation performance of the light-transmitting area is not good, an amount of the incident light into the light-transmitting area is low, and the manufacturing cost is high.

Technical Solutions

To achieve the above objects, the present invention provides an organic light emitting display panel, which has a light-transmitting area and a display area surrounding the light-transmitting area.

The organic light emitting display panel includes a functional structure layer, a light-emitting layer, a thin-film encapsulation, and a light-transmitting hole. The light-emitting layer is provided on the functional structure layer, the thin-film encapsulation layer is covering the light-emitting layer, and the light-transmitting hole is penetrating from the light-emitting layer to the functional structure layer and corresponding to the light-transmitting area.

The thin-film encapsulation layer extends from a surface of the light-emitting layer away from the functional structure layer to a wall surface of the functional structure layer facing to the light-transmitting hole.

Further, the functional structure layer includes a polyimide layer, a buffer layer, an active layer, a gate insulating layer, a gate layer, a dielectric layer, a source/drain electrode, a planarization layer, a pixel electrode, a pixel defining layer, a spacer, and an overflow-preventing groove.

The buffer layer is provided on the polyimide layer, the active layer is provided on the buffer layer, the gate insulating layer is provided on the active layer and the buffer layer, the gate layer is provided on the gate insulating layer, the dielectric layer is provided on the gate layer and the gate insulating layer, the source/drain electrode is provided on the dielectric layer and connected to the active layer, the planarization layer is provided on the source/drain electrode and the dielectric layer, the pixel electrode is provided on the planarization layer and connected to the source/drain electrode, the pixel defining layer is provided on the pixel electrode and the planarization layer, the plurality of spacers is provided on the pixel defining layer, and the overflow-preventing groove is extended from the spacers to the dielectric layer and located between the light-transmitting hole and the source/drain electrode and the pixel electrode.

Further, the organic light emitting display panel further includes a touch panel, a polarizer, a back plate, a cover plate, and a light absorbing film. The touch panel is provided on the thin-film encapsulation layer, the polarizer is provided on the touch panel, the back plate is provided on a surface of the functional structure layer away from the light-emitting layer, the cover plate is provided on the polarizer, and the light absorbing film is provided between the polarizer and the cover plate, and located at an edge of the light-transmitting hole. The light-transmitting hole penetrates from the polarizer to the functional structure layer.

Further, a diameter of the light-transmitting hole is smaller than or equal to a diameter of the light-transmitting area.

The present invention also provides a manufacturing method of an organic light emitting display panel, comprising steps of: providing a substrate, forming a functional structure layer on the substrate, and forming a light-transmitting hole in the functional structure layer, forming a light-emitting layer on the functional structure layer, forming a thin-film encapsulation layer on the substrate, and removing the thin-film encapsulation layer on the substrate and in the light-transmitting hole.

Further, the step of forming the functional structure layer comprises steps of: forming a polyimide layer on the substrate; sequentially forming a buffer layer, an active layer, a gate insulating layer, and a gate layer on the polyimide layer, and forming the light-transmitting hole in the buffer layer and the gate insulating layer; forming a dielectric layer, a source/drain electrode, a planarization layer, a pixel electrode, a pixel defining layer and a plurality of spacers on the gate layer, and forming an overflow-preventing groove and the light-transmitting hole in the dielectric layer, the planarization layer, the pixel defining layer and the spacers, and removing the polyimide layer in the light-transmitting hole.

Further, the step of removing the thin-film encapsulation layer on the substrate and in the light-transmitting hole comprises step of: peeling the substrate by a laser peeling technology, wherein the laser peeling technology causes the thin-film encapsulation layer in the light-transmitting hole to be broken and peeled off.

Further, the thin-film encapsulation layer extends from a surface of the light-emitting layer away from the functional structure layer to a wall surface of the functional structure layer facing to the light-transmitting hole.

Further, between the step of forming the thin-film encapsulation layer and the step of removing the thin-film encapsulation layer on the substrate and in the light-transmitting hole further comprises a step of: forming a touch panel and a polarizer on the thin-film encapsulation layer;

The manufacturing method of the organic light-emitting display panel further comprises steps of: providing a back plate and attaching the back plate to a surface of the functional structure layer away from the light-emitting layer; provide a cover plate; forming a light absorbing film on the cover plate; and attaching a surface of the cover plate having the light absorbing film to the polarizer.

Beneficial Effect:

The advantages of the present invention are as follow:

In the organic light-emitting display panel provided in the present invention, the thin-film encapsulation layer extends to cover the wall surface of the functional structure layer facing to the light-transmitting hole, thereby preventing moisture and oxygen from invading the functional structure layer and the light-emitting layer through the light-transmitting hole. The components of the organic light-emitting display panel are protected in an all-round way to prevent corrosion, thereby improving the service lifespan of the organic light-emitting display panel.

Compared with the existing manufacturing method, a manufacturing method of the organic light-emitting display panel provided by the present invention is simple in industry, has fewer process steps, reduces the manufacturing time, and has low manufacturing costs.

The components in the figures are as follows:
Organic light-emitting display panel 1000.
Light transmitting area 10, display area 20.
Functional structure layer 100, polyimide layer 101.
Buffer layer 102, active layer 103.
Gate insulating layer 104, gate layer 105.
Dielectric layer 106, source/drain electrode 107.
Planarization layer 108, pixel electrode 109.
Pixel defining layer 110, spacer 111.
Overflow-preventing groove 112, light-emitting layer 200.
Thin-film encapsulation layer 300, first inorganic layer 301.
Organic layer 302, second inorganic layer 303.
Light transmitting hole 400, touch panel 500.
Polarizer 600, back plate 700.
Cover plate 800, light absorbing film 801.
Optical glue 900, substrate 30.

DETAILED DESCRIPTION OF EMBODIMENTS

The following describes preferred embodiments of the present invention with reference to the accompanying drawings of the specification to prove that the present invention can be implemented. The embodiments of the present invention can completely introduce to those skilled in the art, and make the technical content thereof more clear and easy to understand. The present invention may be implemented by many different forms of the embodiments of the present invention, and the protection scope of the present invention is not limited to the embodiments mentioned in the text.

In the drawings, components having the same structure are denoted by the same reference numerals, and components having similar structures or functions are denoted by similar reference numerals. The size and thickness of each component shown in the drawings are arbitrarily shown, and the present invention does not limit the size and thickness of each component. In order to make the illustration clearer, the thickness of parts is exaggerated in some places in the drawings.

In addition, the following descriptions of each embodiment of the invention are made with reference to additional illustrations, which are used to illustrate specific embodiments of the invention that can be implemented by the invention. The directional terms mentioned in the present invention, for example, "up", "down", "front", "rear", "left", "right", "inside", "outside", "side", etc., only refers to the direction of the attached drawings. Therefore, the directional terminology is used to better and more clearly explain and understand the present invention, rather than to indicate or imply that the device or element referred to must have a specific orientation, structure and operation in a specific orientation. Therefore, it cannot be understood as a limitation to the present invention. In addition, the terms "first", "second", "third" and so on are used for descriptive purposes only and should not be construed to indicate or imply relative importance.

When certain components are described as being "on" another component, the component may be placed directly on the other component; there may also be an intermediate component on which the component is placed, and the intermediate component is placed on another component. When a component is described as "mounted to" or "connected to" another component, they can be understood as directly "mounted" or "connected", or a component is indirectly "mounted to" or "connected" through an intermediate component to "another part.

Figure 9:
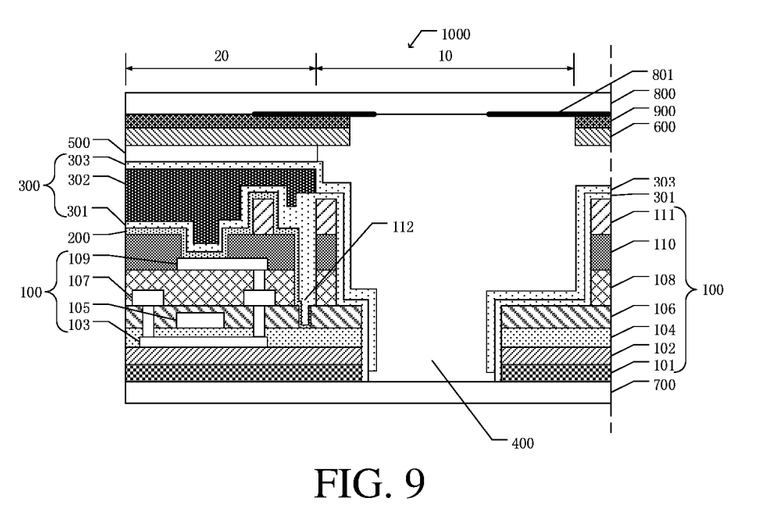
FIG. 9 is a schematic view of a layer structure of an organic light emitting display panel according to an embodiment of the present invention.

An embodiment of the present invention provides an organic light emitting display panel 1000. As shown in FIG. 9, the organic light emitting display panel 1000 has a light-transmitting area 10 and a display area 20 surrounding the light-transmitting area 10, and the light-transmitting area 10 is configured to provide a light extraction channel for under-screen components such as a camera, and the display area 20 is configured to provide displaying images.

In the display area 20, the organic light emitting display panel 1000 includes a functional structure layer 100, a light-emitting layer 200, and a thin-film encapsulation 300. The organic light-emitting display panel 1000 has a light-transmitting hole 400 within the light-transmitting area 10, a diameter of the light-transmitting hole 400 is less than or equal to a diameter of the light-transmitting area 10. In this embodiment, the diameter of the light-transmitting hole 400 is less than the diameter of the light-transmitting area 10.

The functional structure layer 100 includes a polyimide layer 101, a buffer layer 102, an active layer 103, a gate insulating layer 104, a gate layer 105, a dielectric layer 106, a source/drain electrode 107 layer, a planarization layer 108, a pixel electrode 109, a pixel defining layer 110, and spacers 111. The buffer layer 102 is provided on the polyimide layer 101 and is configured to protect the functional structure layer 100 and an overall structure of the organic light emitting display panel 1000. The active layer 103 is provided on a surface of the buffer layer 102 away from the polyimide layer 101. The gate insulating layer 104 covers the active layer 103 and the buffer layer 102, and the gate insulating layer 104 is configured to insulate and protect the active layer 103 and the gate layer 105. The gate layer 105 is provided on the gate insulating layer 104 and corresponds to the active layer 103. The dielectric layer 106 is provided on the gate layer 105 and the gate insulating layer 104, and is configured to insulate the gate layer 105 and the source/drain electrode 107 and protect the gate layer 105. The source/drain electrode 107 is provided on the dielectric layer 106, and is connected to both ends of the active layer 103 through the dielectric layer 106 and the gate insulating layer 104. The planarization layer 108 covers the source/drain electrode 107 and the dielectric layer 106, and is configured to insulate and protect the source/drain electrode 107 and planarizing a surface of the source/drain electrode 107. The pixel electrode 109 is provided on the planarization layer 108, and one end of the pixel electrode 109 passes through the planarization layer 108 and connects the source/drain electrode 107. The pixel defining layer 110 is provided on the pixel electrode 109 and the planarization layer 108. The pixel defining layer 110 has an opening at the pixel electrode 109. The pixel defining layer 110 is configured to limit a size and a position of each light-emitting unit of the light-emitting layer 200. The spacers 111 are provided on the pixel defining layer 110 and configured for support and buffer protection.

The light-emitting layer 200 is provided on the functional structure layer 100 and includes a hole transport layer, a hole injection layer, an organic light-emitting layer, an electron transport layer, an electron injection layer, an anode, a cathode, and an organic cover layer. The hole injection layer is provided on the anode, the hole transport layer is provided on the hole injection layer away from the anode, and the organic light-emitting layer is provided on a surface of the hole transport layer away from the hole injection layer, the electron transport layer is provided on a surface of the organic light-emitting layer away from the hole injection layer, the electron injection layer is provided on a surface of the electron transport layer away from the organic light-emitting layer, the cathode is provided on a surface of the electron injection layer away from the electron transport layer, and the organic cover layer is provided on a surface of the cathode away from the electron transport layer. The organic light-emitting layer is correspondingly provided in the opening. The anode and the cathode transmit a direct current to the hole injection layer and the electron injection layer of the light-emitting layer 200, so that the holes in the hole injection layer and the electrons in the electron injection layer meet each other and are combined with each other in the organic light-emitting layer. The chemical molecules in the organic light-emitting layer are excited to release fluorescence or phosphorescence to achieve organic electroluminescence, thereby achieving organic electroluminescence.

The functional structure layer 100 generates an electric field by applying a voltage to the gate layer 105, and the electric field causes a surface of the active layer 103 to generate induced charges and change a thickness of the conductive channel, so as to achieve the purpose of controlling the current of the source/drain electrode 107. The pixel electrode 109 is electrically connected to the source/drain electrode 107, and transmits current to the light-emitting layer 200 to cause the light-emitting layer 200 to emit light and display images.

The thin-film encapsulation 300 covers a surface of the light-emitting layer 200 away from the functional structure layer 100, and extends to cover a wall surface of the functional structure layer 100 facing to the light-transmitting hole 400. The thin-film encapsulation 300 includes a first inorganic layer 301, a second inorganic layer 303, and an organic layer 302. The first inorganic layer 301 is provided on a side of the thin-film encapsulation 300 near the light-emitting layer 200. The second inorganic layer 303 is provided on the first inorganic layer 301. The organic layer 302 is provided between the first inorganic layer 301 and the second inorganic layer 303. The organic layer 302 corresponds to the light-emitting layer 200, and the first inorganic layer 301 covers a surface of the light-emitting layer 200 away from the functional structure layer 100, and extends to cover a wall surface of the functional structure layer 100 facing to the light-transmitting hole 400. The second inorganic layer 303 covers a surface of the organic layer 302 away from the first inorganic layer 301, and extends to cover a side wall of the first inorganic layer 301 facing to the light-transmitting hole 400. The thin-film encapsulation 300 adopts a structure in which inorganic layers and an organic layer 302 are alternately stacked, the inorganic layer is configured to improve the ability to block moisture and oxygen, and the organic layer 302 is configured to reduce stress, which can effectively protect the functional structure layer 100 and light-emitting layer 200, and prevent moisture and oxygen from invading the functional structure layer 100, and improve the service lifespan of the organic light emitting display panel 1000.

The functional structure layer 100 also has an overflow-preventing groove 112, and the overflow-preventing groove 112 extends from the spacer 111 to the dielectric layer 106, and is located between the light-transmitting hole 400 and the source/drain electrode 107, and also between the light-transmitting hole 400 and the pixel electrode109. The overflow-preventing groove 112 is configured to prevent the organic layer 302 of the thin-film encapsulation 300 from overflowing.

The organic light-emitting display panel 1000 further includes a touch panel 500, a polarizer 600, a cover plate 800 and a back plate 700. The touch panel 500 is provided on a surface of the thin-film encapsulation 300 away from the light-emitting layer 200, and the organic light-emitting display panel 1000 implements the touch control through the touch panel 500. The polarizer 600 is provided on a surface of the touch panel 500 away from the thin-film encapsulation 300, and is configured to convert light emitted by the light-emitting layer 200 into a polarized light. The cover plate 800 is attached to a surface of the polarizer 600 away from the touch panel 500 through an optical glue 900 (optically clear adhesive, OCA). The back plate 700 covers a surface of the functional structure layer 100 away from the light-emitting layer 200. The cover plate 800 and the back plate 700 are configured to protect the overall structure of the organic light emitting display panel 1000.

In the embodiment of the present invention, the light-transmitting hole 400 extends from the polarizer 600 to the functional structure layer 100, a light absorbing film 801 is provided on a surface of the cover plate 800 away from the polarizer 600, and the light absorbing film 801 is located at an edge of the light-transmitting hole 400 and is black to reduce the reflection of light.

In the organic light-emitting display panel 1000 provided in the present invention, the thin-film encapsulation layer 300 extends to cover a wall surface of the functional structure layer 100 facing to the light-transmitting hole 400, thereby preventing moisture and oxygen from invading the functional structure layer 100 and the light-emitting layer 200 from the light-transmitting hole 400. The components of the organic light-emitting display panel 1000 are protected in an all-round way to prevent corrosion, thereby improving the service lifespan of the organic light-emitting display panel 1000, and improving user experience.

Figure 1:
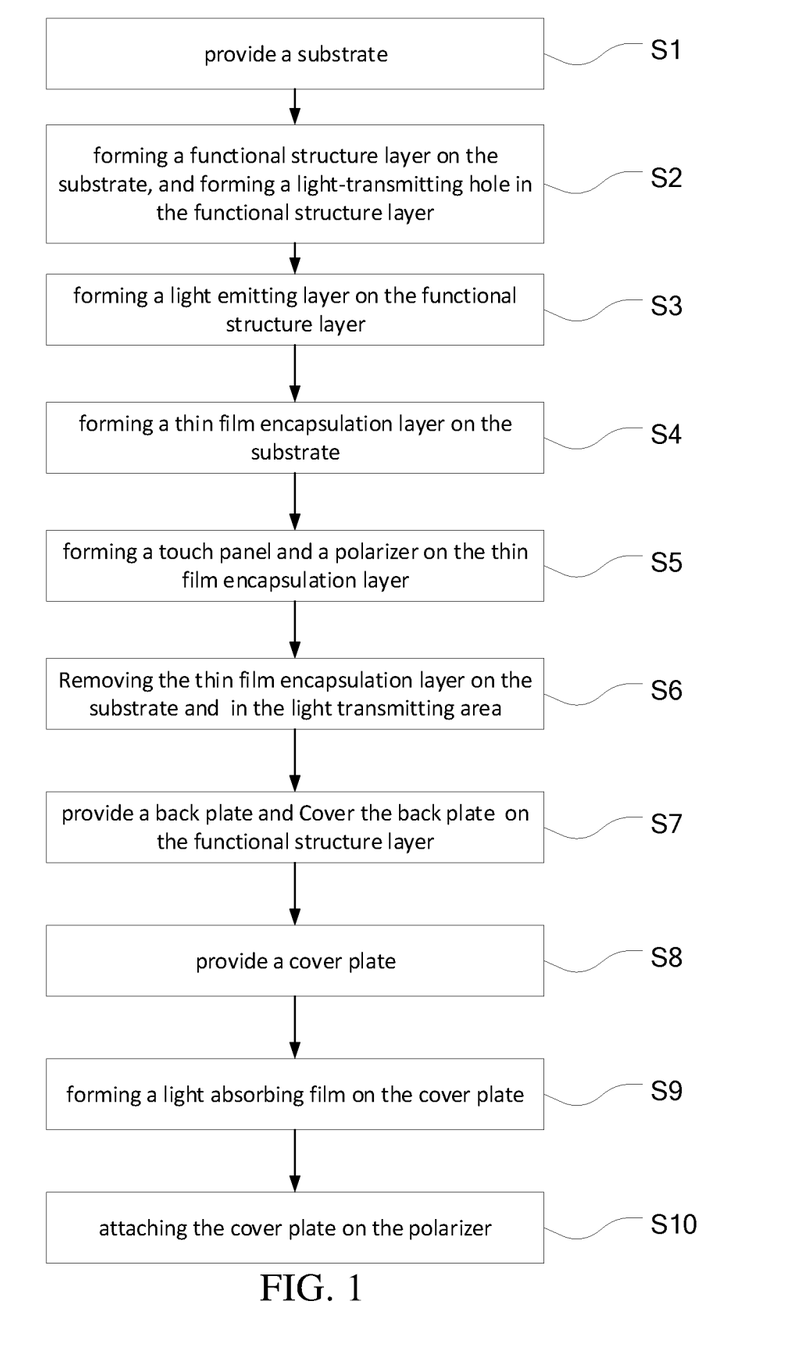
FIG. 1 is a schematic flowchart of a manufacturing method of an embodiment of the present invention.

An embodiment of the present invention also provides a manufacturing method of the organic light-emitting display panel 1000. The manufacturing process is shown in FIG. 1. The specific manufacturing steps include following steps:

A step S1 of providing a substrate 30. The substrate 30 is a glass substrate.

A step S2 of forming a functional structure layer 100 on the substrate 30, and forming a light-transmitting hole 400 in the functional structure layer 100.

Figure 2:
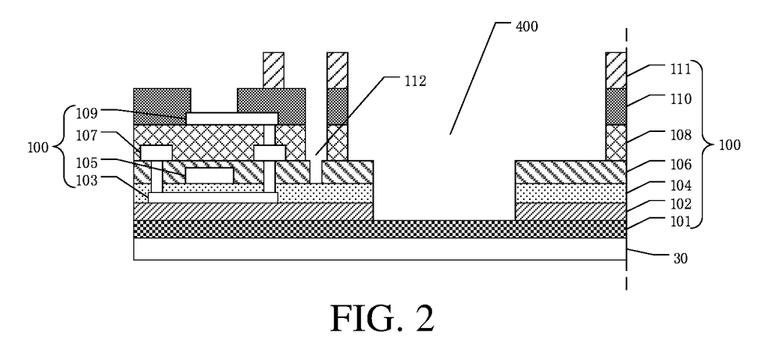
FIG. 2 is a schematic view of a layer structure in the step S2 of the embodiment of the present invention.

As shown in FIG. 2, a layer of polyimide is deposited on the substrate 30 to form a polyimide layer 101. A buffer layer 102, an active layer 103, a gate insulating layer 104, a gate layer 105, a dielectric layer 106, a source/drain electrode 107, a planarization layer 108, a pixel electrode 109, a pixel defining layer 110, and a plurality of spacer 111 are sequentially formed on the polyimide layer 101 by a low temperature polysilicon process. In the manufacturing process of the buffer layer 102 and the gate insulating layer 104, the buffer layer 102 and the gate insulating layer 104 need to be separately subjected a lithography process through a mask to form a light-transmitting hole 400 in a corresponding area. In the manufacturing process of the dielectric layer 106, the planarization layer 108, the pixel defining layer 110, and the spacers 111, the dielectric layer 106, the planarization layer 108, the pixel defining layer 110, and the spacers 111 also need to be separately subjected to a lithography technique to form an overflow-preventing groove 112 and the light-transmitting hole 400 in a corresponding area.

Figure 3:
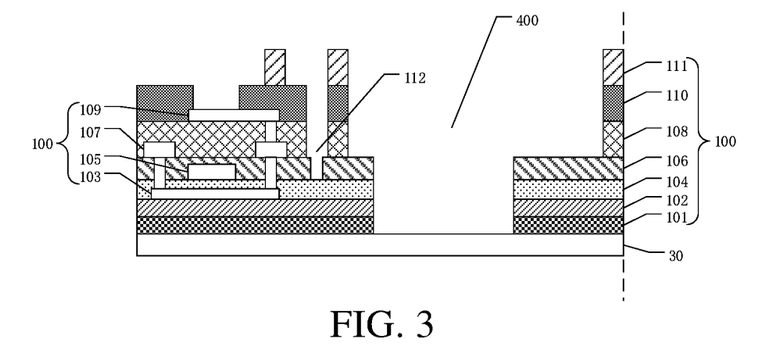
FIG. 3 is a schematic view of a layer structure after the step S2 of the embodiment of the present invention.

As shown in FIG. 3, the polyimide layer 101 in the light-transmitting hole 400 is removed by a laser lithography technology. This step can be performed directly in the air atmosphere, and does not need to be performed in a vacuum environment or an inert gas atmosphere.

A step S3 of forming a light-emitting layer 200 on the functional structure layer 100.

Figure 4:
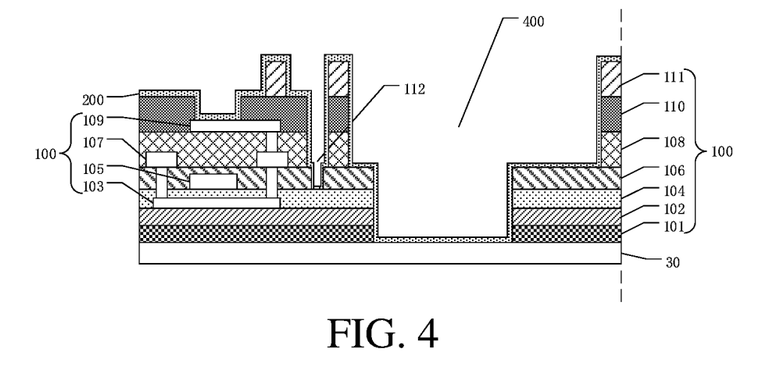
FIG. 4 is a schematic view of a layer structure in the step S3 of the embodiment of the present invention.

As shown in FIG. 4, an anode, a hole injection layer, a hole transport layer, an organic light-emitting layer, an electron transport layer, an electron injection layer, a cathode and an organic cover layer are formed on the functional structure layer 100 by an evaporation process. The layers from the anode to the organic cover layer are combined to form the light-emitting layer 200.

Figure 5:
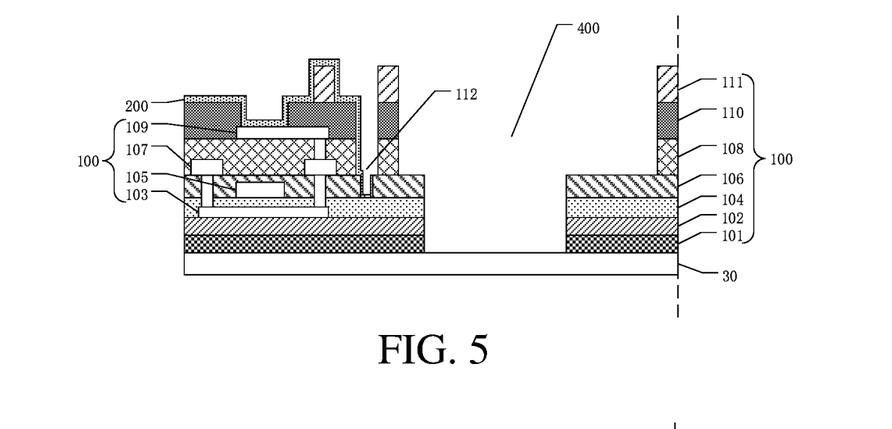
FIG. 5 is a schematic view of a layer structure after the step S3 of the embodiment of the present invention.

As shown in FIG. 5, the light-emitting layer 200 in the light-transmitting hole 400 is removed by the laser lithography technology to pattern the light-emitting layer 200.

A step S4 of forming a thin-film encapsulation 300 on the substrate 30.

Figure 6:
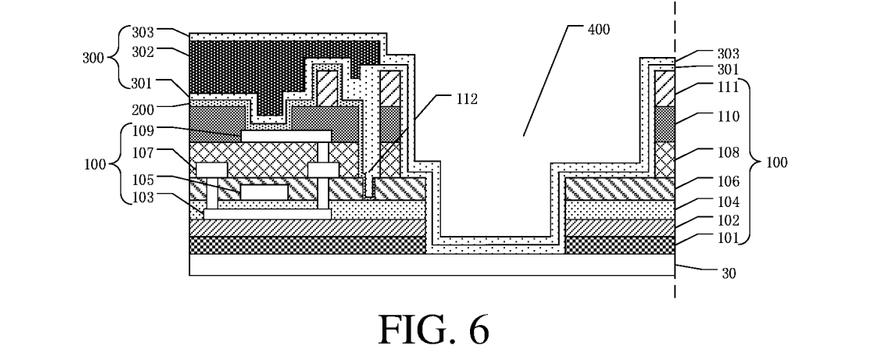
FIG. 6 is a schematic view of a layer structure after the step S4 of the embodiment of the present invention.

As shown in FIG. 6, material of a first inorganic layer 301 is deposited on the substrate 30 by a chemical vapor deposition process, and the first inorganic layer 301 completely covers the light-emitting layer 200, the functional structure layer 100, and the substrate 30. An organic layer 302 is formed on the first inorganic layer 301 by inkjet printing, and the organic layer 302 corresponds to the light-emitting layer 200. Material of a second inorganic layer 303 is deposited on the organic layer 302 and the first inorganic layer 301 by a chemical vapor deposition process, so that the second inorganic layer 303 completely covers the organic layer 302 and the first inorganic layer 301. The first inorganic layer 301, the organic layer 302, and the second inorganic layer 303 are combined to form the thin-film encapsulation 300.

A step S5 of forming a touch panel 500 and a polarizer 600 on the thin-film encapsulation 300.

Figure 7:
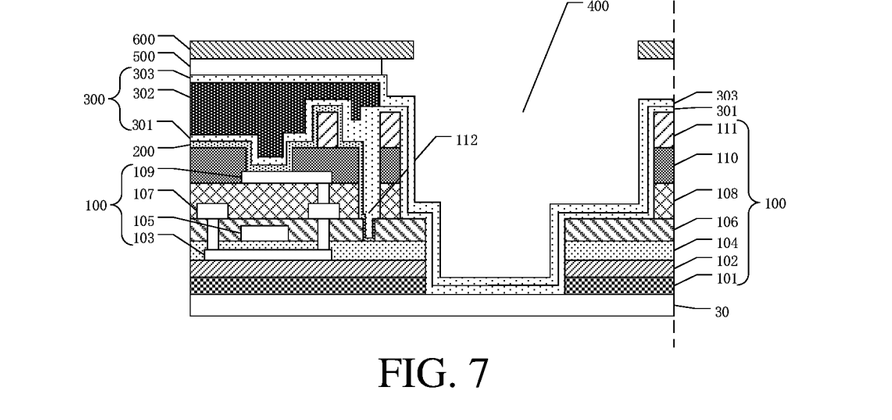
FIG. 7 is a schematic view of a layer structure after the step S5 of the embodiment of the present invention.

FIG. 7 shows the touch panel 500 formed through a touch control forming process on the thin-film encapsulation 300, and the light-transmitting hole 400 formed in the touch panel 500. The polarizer 600 is attached to a surface of the touch panel 500 away from the thin-film encapsulation 300, and the light-transmitting hole 400 is also formed on the polarizer 600.

A step S6 of removing the thin-film encapsulation 300 on the substrate 30 and in the light-transmitting hole 400.

Figure 8:
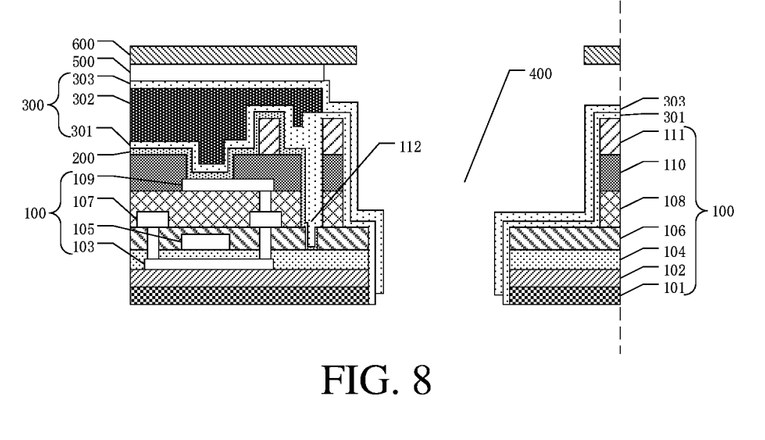
FIG. 8 is a schematic view of a layer structure after the step S6 of the embodiment of the present invention.

As shown in FIG. 8, an adhesion force between the polyimide layer 101 and the substrate 30 is reduced by a laser peeling process, so as to peel the substrate 30. At the same time, the laser energy during the laser peeling process passes through the substrate 30 and transfers to the thin-film encapsulation 300 in the light-transmitting hole 400, which causes the first inorganic layer 301 and the second inorganic layer 303 in the thin-film encapsulation 300 to be broken. Therefore, the first inorganic layer 301 and second inorganic layer 303 of the thin-film encapsulation 300 in the light-transmitting hole 400 are also peeled off while the substrate 30 is peeled off.

Because a bonding force between the polyimide layer 101 and the substrate 30 is smaller than the bonding force between the first inorganic layer 301 and the second inorganic layer 303 of the thin-film encapsulation 300 in the light-transmitting hole 400, a desired laser energy required for breaking the thin-film encapsulation 300 in the light-transmitting hole 400 needs to be greater than a laser energy when the polyimide layer 101 is separated from the substrate 30.

A step S7 of providing a back plate 700, and attaching the back plate 700 to a surface of the functional structure layer 100 away from the light-emitting layer 200.

A step S8 of providing a cover plate 800, and the cover plate 800 is transparent glass.

A step S9 of forming a light absorbing film 801 on the cover plate 800.

A layer of black light absorbing film 801 is coated on a surface of the cover plate 800 and an area corresponding to an edge of the light-transmitting hole 400.

A step S10 of attaching the cover plate 800 to the polarizer 600.

A layer of optical glue 900 is coated on the polarizer 600, and a surface of the cover plate 800 having the light absorbing film 801 is attached to the polarizer 600 by the optical glue 900 to form a layer structure of the light emitting display panel 1000 as shown in FIG. 9.

Compared with the existing manufacturing method, the manufacturing method of the organic light-emitting display panel 1000 provided in the embodiment of the present invention is simple in industry, has fewer process steps, reduce the manufacturing time, and has low manufacturing costs. In addition, the removal of the polyimide layer 101 in the light-transmitting hole 400 described in the embodiment of the present invention does not require to be performed in a vacuum environment or an inert gas atmosphere, and can be directly performed in an air atmosphere, so as to further reduce the manufacturing costs.

Although the invention is described herein with reference to specific embodiments, it should be understood that these embodiments are merely examples of the principles and applications of the invention. It should therefore be understood that many modifications can be made to the exemplary embodiments and that other arrangements can be devised without departing from the spirit and scope of the invention as defined by the appended claims. It should be understood that different dependent claims and features described herein may be combined in a manner different from that described in the original claims. It can also be understood that features described in connection with separate embodiments may be used in other described embodiments.

The invention claimed is:

1. An organic light-emitting display panel having a light-transmitting area and a display area surrounding the light-transmitting area, the organic light-emitting display panel comprising:
   a functional structure layer;
   a light-emitting layer provided on the functional structure layer;
   a thin-film encapsulation layer covering the light-emitting layer; and
   a light-transmitting hole penetrating from the light-emitting layer to the functional structure layer and corresponding to the light-transmitting area;
   wherein the thin-film encapsulation layer extends from a surface of the light-emitting layer away from the functional structure layer to a wall surface of the functional structure layer facing to the light-transmitting hole,
   wherein the functional structure layer comprises:
   a dielectric layer;
   a planarization layer provided on the dielectric layer;
   a pixel defining layer provided on the planarization layer;
   a plurality of spacers provided on the pixel defining layer; and
   an overflow-preventing groove passing through the spacers, the pixel defining layer, the planarization layer, and the dielectric layer, and located between the light-transmitting hole and a pixel electrode, wherein a portion of the thin-film encapsulation layer is filled into the overflow-preventing groove to prevent an organic layer of the thin-film encapsulation from overflowing.

2. The organic light-emitting display panel according to claim 1, wherein the functional structure layer comprises:
   a polyimide layer;
   a buffer layer provided on the polyimide layer;
   an active layer provided on the buffer layer;
   a gate insulating layer provided on the active layer and the buffer layer;
   a gate layer provided on the gate insulating layer;
   the dielectric layer provided on the gate layer and the gate insulating layer;
   a source/drain electrode provided on the dielectric layer and connected to the active layer;
   the planarization layer provided on the source/drain electrode and the dielectric layer;
   the pixel electrode provided on the planarization layer and connected to the source/drain electrode;
   the pixel defining layer provided on the pixel electrode and the planarization layer;
   the spacers provided on the pixel defining layer; and
   an overflow-preventing groove extended from the spacers to the dielectric layer and located between the light-transmitting hole and the source/drain electrode and the pixel electrode.

3. The organic light-emitting display panel according to claim 1, further comprising:
   a touch panel provided on the thin-film encapsulation layer;
   a polarizer provided on the touch panel;
   a back plate provided on a surface of the functional structure layer away from the light-emitting layer;
   a cover plate provided on the polarizer; and
   a light absorbing film provided between the polarizer and the cover plate, and located at an edge of the light-transmitting hole;
   wherein the light-transmitting hole penetrates from the polarizer to the functional structure layer.

4. The organic light-emitting display panel according to claim 1, wherein a diameter of the light-transmitting hole is smaller than or equal to a diameter of the light-transmitting area.

5. A manufacturing method of an organic light-emitting display panel, comprising steps of:
   providing a substrate;
   forming a functional structure layer on the substrate, and forming a light-transmitting hole in the functional structure layer, wherein the functional structure layer comprises: a dielectric layer;
   a planarization layer provided on the dielectric layer; a pixel defining layer provided on the planarization layer; and a plurality of spacers provided on the pixel defining layer;;
   forming a light-emitting layer on the functional structure layer;
   forming an overflow-preventing groove passing through the spacers, the pixel defining layer, the planarization layer, and the dielectric layer, and located between the light-transmitting hole and a pixel electrode;
   forming a thin-film encapsulation layer on the substrate, wherein a portion of the thin-film encapsulation layer is filled into the overflow-preventing groove to prevent an organic layer of the thin-film encapsulation from overflowing; and
   removing the thin-film encapsulation layer on the substrate and in the light-transmitting hole.

6. The manufacturing method according to claim 5, wherein the step of forming the functional structure layer comprises steps of:

forming a polyimide layer on the substrate;

sequentially forming a buffer layer, an active layer, a gate insulating layer, and a gate layer on the polyimide layer, and forming the light-transmitting hole in the buffer layer and the gate insulating layer;

forming the dielectric layer, a source/drain electrode, the planarization layer, the pixel electrode, the pixel defining layer and a plurality of the spacers on the gate layer, and forming the light-transmitting hole in the dielectric layer, the planarization layer, the pixel defining layer and the spacers; and removing the polyimide layer in the light-transmitting hole.

7. The manufacturing method according to claim 5, wherein the step of forming the light-emitting layer comprises steps of:

depositing material of the light-emitting layer on the functional structure layer by an evaporation process; and patterning the light-emitting layer by a laser lithography technology to remove the light-emitting layer in the light-transmitting hole.

8. The manufacturing method according to claim 5, wherein the step of removing the thin-film encapsulation layer on the substrate and in the light-transmitting hole comprises step of:

peeling the substrate by a laser peeling technology, wherein the laser peeling technology causes the thin-film encapsulation layer in the light-transmitting hole to be broken and peeled off.

9. The manufacturing method according to claim 8, wherein the thin-film encapsulation layer extends from a surface of the light-emitting layer away from the functional structure layer to a wall surface of the functional structure layer facing to the light-transmitting hole.

10. The manufacturing method according to claim 5, wherein between the step of forming the thin-film encapsulation layer and the step of removing the thin-film encapsulation layer on the substrate and in the light-transmitting hole further comprises a step of:

forming a touch panel and a polarizer on the thin-film encapsulation layer; and wherein the manufacturing method of the organic light-emitting display panel further comprises steps of:

providing a back plate and attaching the back plate to a surface of the functional structure layer away from the light-emitting layer;

provide a cover plate;

forming a light absorbing film on the cover plate; and attaching a surface of the cover plate having the light absorbing film to the polarizer.

\* \* \* \* \*